US006914987B2

(12) United States Patent
Blind et al.

(10) Patent No.: US 6,914,987 B2
(45) Date of Patent: Jul. 5, 2005

(54) AUDIO AMPLIFIER WITH VOLTAGE LIMITING IN RESPONSE TO SPECTRAL CONTENT

(75) Inventors: Henry Francis Blind, Grosse Pointe Woods, MI (US); John Elliott Whitecar, Plymouth, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 765 days.

(21) Appl. No.: 10/034,239

(22) Filed: Dec. 19, 2001

(65) Prior Publication Data

US 2002/0090096 A1 Jul. 11, 2002

(51) Int. Cl.[7] .......................... H04H 5/00; H03F 21/00
(52) U.S. Cl. ...................... 381/13; 381/120; 455/296
(58) Field of Search .......................... 381/2, 4, 13–16, 381/83, 93, 98, 102, 94.1, 120, 104, 107, 108, 109; 455/222, 295, 296, 297; 330/295, 296

(56) References Cited

U.S. PATENT DOCUMENTS

| 3,740,670 | A | * | 6/1973 | Hoffman ..................... 332/162 |
| 4,246,441 | A | * | 1/1981 | Sugai et al. .................. 381/13 |
| 4,912,424 | A | | 3/1990 | Nicola et al. ............ 381/106 T |
| 4,916,741 | A | * | 4/1990 | Ishikawa ..................... 381/13 |
| 5,255,324 | A | | 10/1993 | Brewer et al. ............. 381/94.1 |
| 5,276,921 | A | * | 1/1994 | Kosugi ....................... 455/119 |
| 5,359,661 | A | * | 10/1994 | Manlove et al. .............. 381/15 |
| 5,671,286 | A | * | 9/1997 | Gottfried et al. ............. 381/13 |
| 5,737,432 | A | | 4/1998 | Werrbach .................... 330/141 |
| 5,768,699 | A | * | 6/1998 | Behan et al. ................ 455/296 |
| 6,061,455 | A | | 5/2000 | Hadley et al. ................ 381/57 |
| 6,104,822 | A | | 8/2000 | Melanson et al. .......... 381/320 |
| 6,125,187 | A | * | 9/2000 | Hanajima et al. ............. 381/83 |
| 6,154,547 | A | | 11/2000 | Whitecar .................... 381/94.2 |
| 6,154,550 | A | | 11/2000 | Beyer ......................... 381/56 |
| 6,340,915 | B1 | * | 1/2002 | Blodgett ....................... 330/52 |
| 6,504,428 | B2 | * | 1/2003 | Cova et al. ................... 330/52 |
| 6,658,116 | B1 | * | 12/2003 | Rychlak ....................... 381/11 |
| 6,760,452 | B2 | * | 7/2004 | Lau et al. ................... 381/106 |

FOREIGN PATENT DOCUMENTS

GB      2 314 476      12/1997

OTHER PUBLICATIONS

ST® Multifunction Quad Power Amplifier with Built–In Diagnostics Features, Model TDA7562, Nov., 2001.

* cited by examiner

Primary Examiner—Xu Mei
(74) Attorney, Agent, or Firm—MacMillan, Sobanski & Todd, LLC

(57) ABSTRACT

Audio signals are reproduced with consistent perception of total harmonic distortion even with varying spectral content of a particular audio signal without separately limiting different frequency bands within the audio signal. A distortion threshold representative of an amount of distortion to be allowed to be introduced by a power amplifier is determined in response to a frequency content of the audio signal. A distortion trigger compares a measured average distortion signal and the distortion threshold and reduces the controllable gain of the amplifier if the average distortion signal exceeds the distortion threshold.

18 Claims, 5 Drawing Sheets

AUDIO AMPLIFIER WITH VOLTAGE LIMITING IN RESPONSE TO SPECTRAL CONTENT

BACKGROUND OF THE INVENTION

The present invention relates in general to audio systems which prevent distortion from amplifier clipping by employing dynamic gain limiting, and more specifically to automotive audio systems for providing a consistent perception of distortion with varying spectral content of a particular audio signal.

Typical audio reproduction systems include a variable-gain amplification stage followed by a fixed-gain power amplifier which feeds an output transducer such as a speaker. A volume or gain command (e.g., a control voltage) provided to the variable gain stage controls the output volume heard by a listener.

An important objective in designing an audio system is to provide minimum distortion in signal reproduction. However, there is always some distortion, especially at high sound levels. As the magnitude of the signal provided from the variable gain amplifier stage to the power amplifier increases above a certain level, the power amplifier becomes overdriven. This situation occurs when the input signal to the power amplifier multiplied by the fixed gain of the power amplifier approaches the supply voltage level provided to the power amplifier. As a result, the power amplifier becomes saturated and signal peaks of the audio signal are distorted by clipping.

The problem of power amplifier clipping is aggravated in automotive audio systems. Less voltage headroom (i.e., safety margin) is available to the power amplifier since the automobile is limited to a 12-volt electrical supply. Although a DC/DC converter can be used to obtain a higher DC voltage, such converters are relatively expensive. Also, bass boost is needed in the automotive environment to overcome low frequency road and engine noise, making clipping more likely in the bass range of the audio signal.

It is known to employ voltage limiting or compression to the input of an amplifier to limit the occurrence of clipping (but some amount of clipping up to the limit is desirable; otherwise it may seem that the audio system does not play loud enough). In prior art voltage limiters, the amplifier gain is reduced when the power amplifier exhibits a specific percentage of total harmonic distortion (THD), typically about 10%. The 10% THD value represents a desirable amount of allowable distortion for typical full-band (i.e., wideband) audio material such as FM broadcasts, CD media, or cassette tape media.

Wideband audio material has significant spectral content at high (i.e., treble) frequencies. This treble content "masks" or makes less audible the distortion occurring at lower frequencies because of the peculiarities of human auditory perception. For narrower bandwidth signals (e.g., AM broadcasts or recording of piano solos) with less treble frequency content, however, this auditory masking does not occur so that the reproduced audio sounds significantly more distorted even though the actual amount of THD has not changed. Thus, prior art audio systems that sound fine while reproducing full-spectrum audio signals can sound very distorted while reproducing bandwidth-limited material such as an AM radio broadcast.

Prior art audio systems are known that separate the audio signal into separate bands for voltage limiting. After limiting, the separate bands must then be mixed back together in the output. The separating elements, additional signal processing paths, and the recombining elements add their own distortion to the signal and add significant expense to the audio system. Thus, it would be desirable to achieve distortion limiting of audio signals that is consistent with the psycho-acoustic effects of treble-frequency masking without requiring separate limiting in multiple frequency bands.

SUMMARY OF THE INVENTION

The present invention has the advantage of reproducing audio signals with consistent perception of total harmonic distortion even with varying spectral content of a particular audio signal without separately limiting different frequency bands within the audio signal.

In one aspect of the invention, an apparatus is provided comprising an audio source generating an audio signal. A pre-amplifier is coupled to the audio source and has a controllable gain for pre-amplifying the audio signal. A power amplifier is coupled to the pre-amplifier and has a substantially fixed gain for amplifying the pre-amplified audio signal. A threshold adjuster generates a distortion threshold representative of an amount of distortion to be allowed to be introduced by the power amplifier in response to a frequency content of the audio signal. A distortion detector coupled to the power amplifier generates a distortion signal in response to the distortion threshold and the audio signal. A gain limiter reduces the controllable gain if the distortion signal exceeds the distortion threshold.

DETAILED DESCRIPTION OF PREFERRED EMBODIMENTS

The present invention adjusts the allowed power amplifier output distortion to a psycho-acoustically-correct value depending upon the bandwidth or spectral content of the source audio signal. For wide-bandwidth material, the distortion is allowed to be higher because of the masking effects of the high frequency content. If band-limited material lacking significant treble content is reproduced, a lower amount of distortion is allowed (i.e., the distortion threshold is lowered) so that the distortion does not begin to sound objectionable.

In a first embodiment, the present invention detects the likelihood of reproducing a band-limited audio signal in response to the audio source from which the audio signal is being obtained. For example, when an AM radio tuner is providing the audio signal, it is known that potentially-masking higher frequency signals will not be present since AM broadcasts cannot reproduce them. However, a band-limited audio signal can also be present while using a wideband audio source, such as listening to a piano solo on a CD, for example. Therefore, in an alternative embodiment, a real-time spectral analysis of the audio signal is performed, whereby an appropriate amount of distortion is allowed at all times regardless of the chosen audio source.

Figure 1:
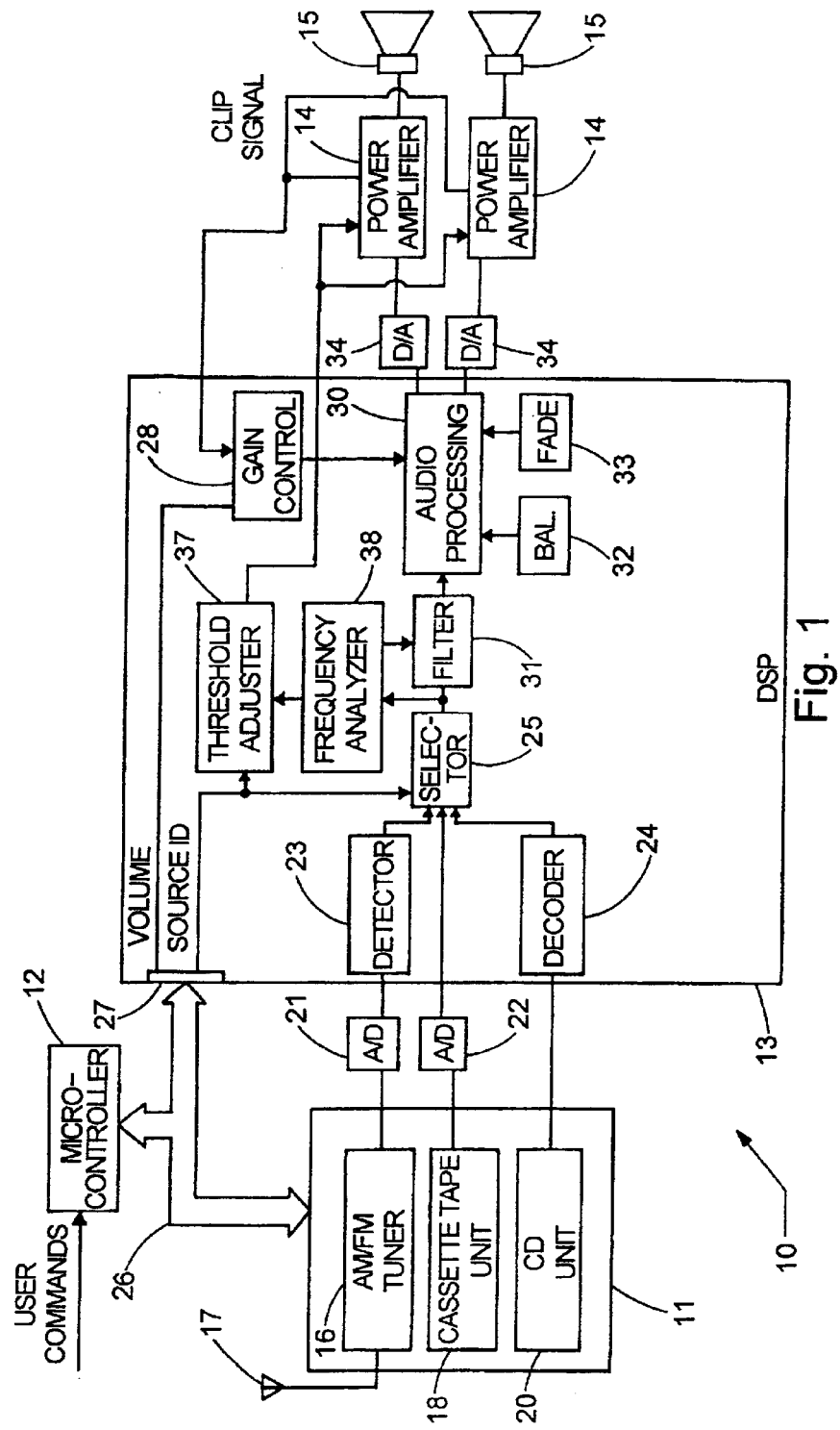
FIG. 1 is a block diagram showing an audio system according to the present invention.

Referring now to FIG. 1, an audio system 10 includes audio sources 11 controlled by a microcontroller 12 and providing their respective audio signals to a digital signal processor (DSP) 13. Processed audio signals are eventually amplified in power amplifiers 14 for driving output loudspeakers 15. Although two output channels are shown, an automotive audio system would typically include four channels.

Audio sources 11 include an AM/FM tuner connected to an antenna 17, a cassette tape unit or mechanism 18, and a compact disc (CD) unit or mechanism 20. Radio intermediate frequency (IF) signals from tuner 16 and audio signals from cassette tape unit 18 are digitized in analog-to-digital (A/D) converters 21 and 22, respectively, prior to being input to DSP 13. DSP 13 contains a digital detector or demodulator 23 that recovers audio band signals from the digitized tuner output and provides the audio signals to one input of a selector 25. A conventional decoder 24 translates CD data from CD unit 20 into properly formatted audio signals for processing in DSP 13 and provides them to another input of selector 25. Digitized audio signals from A/D 22 may be provided directly to selector 25 or may first be reformatted (e.g., sample rate adjustment) or otherwise processed as is known in the art.

Microcontroller 12 receives user commands from a human operator, such as commands for changing audio source or volume level. Commands are relayed to audio sources 11 and DSP 13 via a bus or busses 26 which may also include dedicated signal lines. For instance, a user command for selecting one of the audio sources is detected by microcontroller 12 which activates the identified source and sends a source ID message to selector 25 via a port 27 in DSP 13. When detected, a user commanded volume level (e.g., a volume increase or decrease) is sent by microcontroller 12 to a gain control block 28.

An audio processing block 30 receives the selected audio signal from selector 25 through an audio filter 31. Audio processor 30 implements common audio processing functions such as volume (in response to gain control block 28), left/right balance (in response to balance control block 32), front/rear fade (in response to fade control block (33), bass gain, and treble gain, for example. The processed audio signals are converted to analog signals in digital-to-analog (D/A) converters 34 and then finally amplified by power amplifier integrated circuits 14 (such as the TDA 7563 power amplifier IC available from SGS-Thomson). The gain control within DSP 13 together with the D/A converters performs the function of a variable gain preamplifier. The present invention is equally applicable to any system using analog audio signals amplified by a variable gain analog amplifier.

When power amplifiers 14 are overdriven by the analog signals from D/A converters 34, they generate a conventional clip signal during moments that their input signals multiplied by their fixed gains is greater than their maximum output. The clip signal usually is implemented as a current sink and the clip detect output of the power amplifiers can be hardwired together providing a clip signal to gain control block 28 that is a logical OR of all the power amplifier clip signals. Clip detectors in amplifiers 14 monitor the amount of total harmonic distortion (THD) being introduced into the reproduced audio by the clipping. The clip detectors utilize a distortion threshold for characterizing the severity of clipping at any moment. When the threshold is exceeded, a clip signal is sent to gain block 28 to reduce the gain within audio processor 30. As known in the art, the reduction and then eventual restoration of the gain may be subject to predetermined attack and release rates, respectively.

Figure 2:
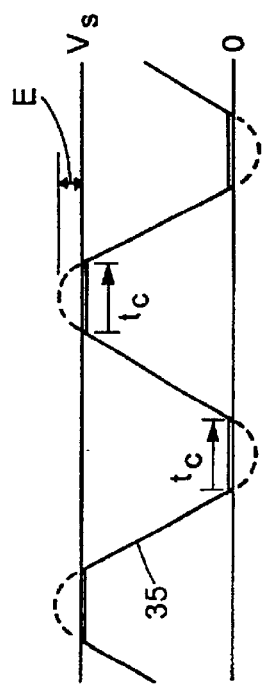
FIG. 2 is a plot showing an audio signal being clipped at a first distortion level.
Figure 3:
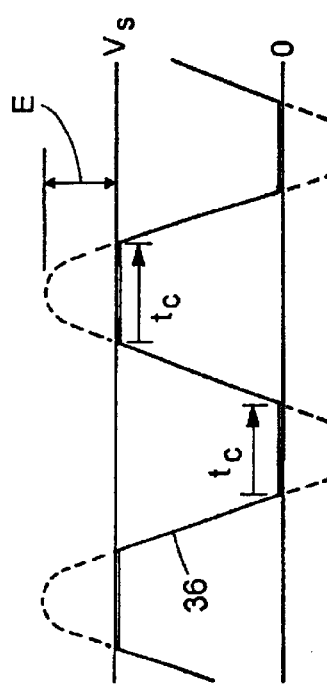
FIG. 3 is a plot showing an audio signal being clipped at a second distortion level.

FIG. 2 shows an audio signal 35 undergoing clipping distortion. The gain factor of the amplifier applied to the pre-amplifier signal coupled to the amplifier input would require an output audio signal having a peak value as shown by the dashed lines, but signal 35 cannot exceed the amplifier supply voltage $V_S$. The flattened peaks introduce harmonic distortion, the severity of which can be characterized both by the peak error E and the aggregate of clipping times $t_c$ over a fixed period. FIG. 3 shows an audio signal 36 undergoing a greater severity of clipping than audio signal 35 (i.e., both error E and the proportion of time spent in a clipping event are greater).

Figure 4:
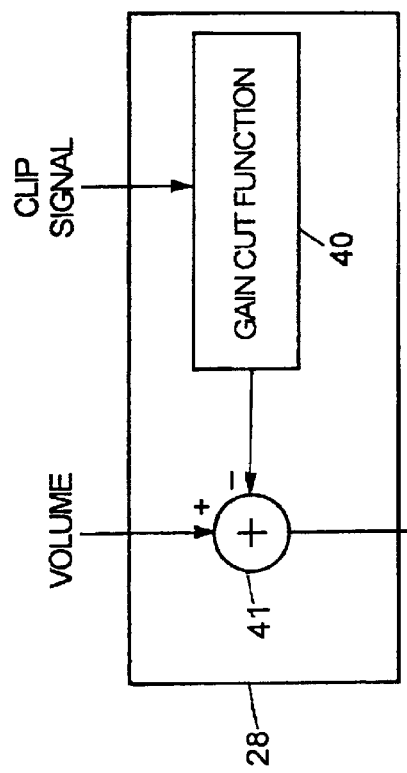
FIG. 4 is a block diagram showing a gain control block of the invention.
Figure 5:
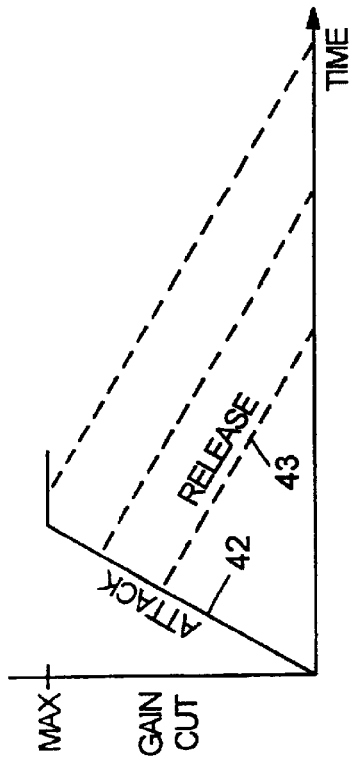
FIG. 5 is a plot showing attack and release functions of the gain control block of FIG. 4.

FIG. 4 shows gain control block 28 in greater detail. A gain-cut function block 40 receives the clip signal from the power amplifiers and calculates an amount of gain cut. The gain cut is applied to a subtracting input of a summer 41. An adding input of summer 41 receives the volume command signal set by the user. The resulting gain signal is coupled to the audio processor for controlling the gain applied to the pre-amplified audio signal. As shown in FIG. 5, the amount of gain cut generated by function 40 depends upon the duration that the clip signal is active. The gain cut increases from zero at a first rate (the attack rate) along the line segment 42. If the clip signal is active for an extraordinarily long time, the gain cut may reach a maximum gain cut (e.g., equal to the volume command). When the clip signal deactivates, the gain cut decreases toward zero at a second rate (the release rate) as shown by line segments 43.

Prior art systems have typically employed a fixed threshold for activating a gain reduction. U.S. Pat. No. 6,061,455 shows a variable threshold wherein the threshold is set as a function of the volume level commanded by the user. This allows a listener that wants more distortion to be able to obtain it. However, excess distortion resulting from the lack of auditory masking when high, treble frequencies are missing is not corrected by that patent.

Figure 6:
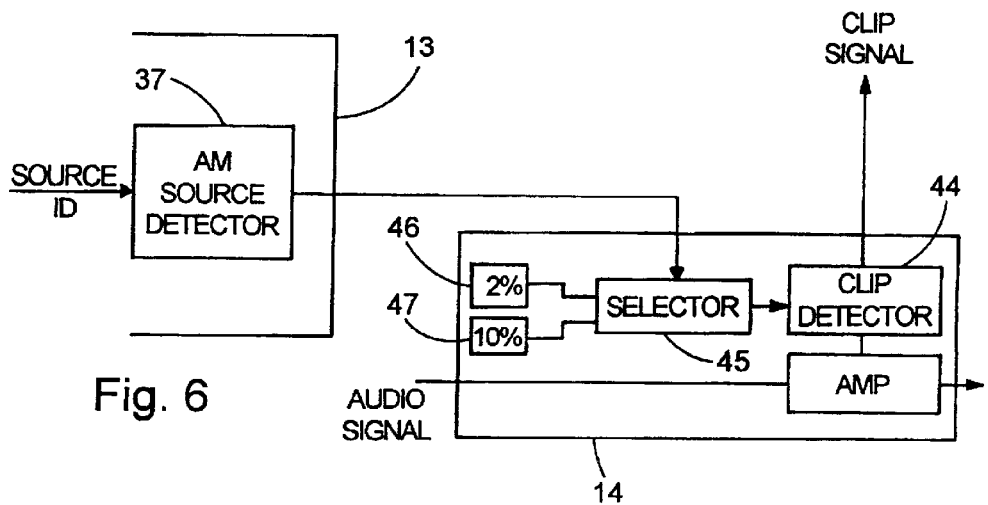
FIG. 6 is a block diagram showing a first embodiment of a threshold selector.

The present invention solves this problem by means of a threshold adjuster 37 for generating a distortion threshold in response to a frequency content of the audio signal. In a first embodiment shown in FIG. 6, threshold adjuster 37 receives the source ID signal and makes a determination of frequency content based on the identity of the audio source being reproduced. Threshold adjuster 37 is comprised of an AM source detector receiving the source ID and sending a distortion selection signal to a selector 45 in power amplifier 14. A high threshold value 47 (e.g., 10% THD) and a low threshold value 46 (e.g., 2% THD) are coupled to respective inputs of selector 45. In a preferred embodiment, if the active audio source is the AM radio tuner then threshold value 46 is selected, but threshold value 47 is selected for all other sources. The selected distortion threshold value is applied to clip detector 44 for distinguishing between respective distortion levels (e.g., greater than a 2% THD as shown in FIG. 2 or greater than a 10% THD as shown in FIG. 3).

This first embodiment provides a simple implementation that infers the likely bandwidth of the audio signal based on the frequency response of the selected source and does not require actual measurement of the frequency content.

In a second embodiment also shown in FIG. 1, a frequency analyzer 38 receives the audio signal and characterizes the actual frequency content of the audio signal at any particular time. A signal characterizing the spectral, high frequency content of the audio signal at that time is provided to threshold adjuster 37 for selecting a distortion threshold in response to the specific high frequency content.

Figure 7:
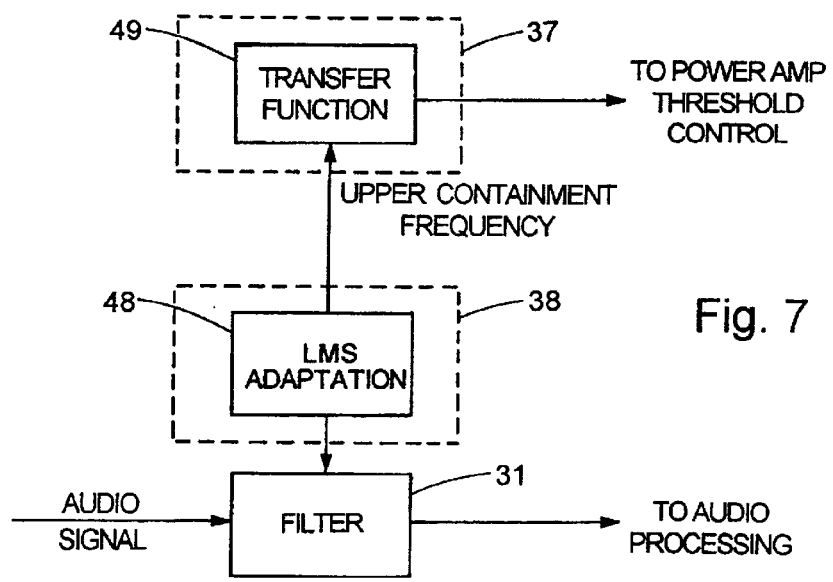
FIG. 7 is a block diagram showing a second embodiment of a threshold detector.

A preferred implementation of this second embodiment is shown in greater detail in FIG. 7. Filter 31 is an adaptive filter of the type disclosed in U.S. Pat. No. 6,154,547, incorporated herein by reference in its entirety. This filter adaptively controls its upper cutoff frequency so that the filter output contains a fixed (high) percentage of the energy entering the filter. In this way, the filter bandwidth is adaptively set to be just wide enough to contain nearly the entire desired signal, thereby eliminating any extraneous noise at higher frequencies. An LMS adaptation 46 achieves the adaptive control of the sliding bandwidth of the filter. In the present invention, this same LMS adaptation 46 is used to detect the frequency content of the audio signal by monitoring the adaptively-set upper cutoff frequency of the filter, referred to herein as the upper containment frequency. The upper containment frequency is converted into a distortion threshold by a transfer function 47 within threshold adjuster 37.

Figure 8:
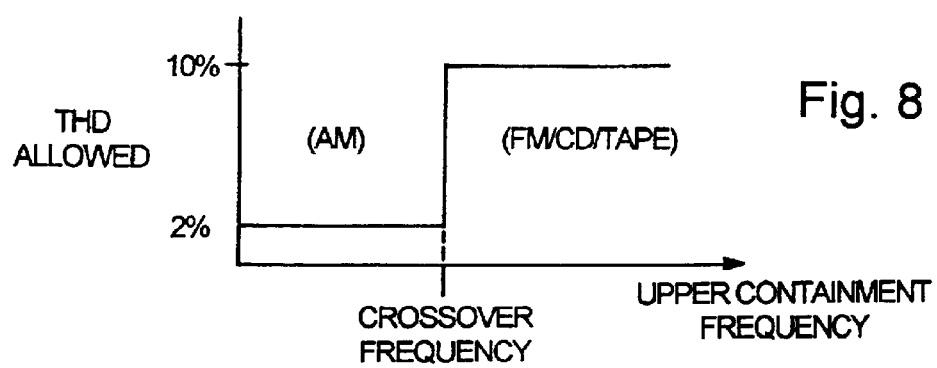
FIG. 8 is plot showing a first transfer function for varying a distortion threshold.

FIG. 8 shows a first example for the transfer function wherein a low threshold (e.g., 2%) is used when the upper containment frequency is below a predetermined crossover frequency (e.g., a value in the range of about 3 kHz to about 5 kHz) and a high threshold (e.g. 10%) is used when the upper containment frequency is above the crossover frequency. FIG. 8 also shows the transfer function used in the previous embodiment wherein selection is based on audio source ID rather than actual frequency spectral content (i.e., the AM tuner source selection results in a 2% threshold and other source selections result in a 10% threshold).

Figure 9:
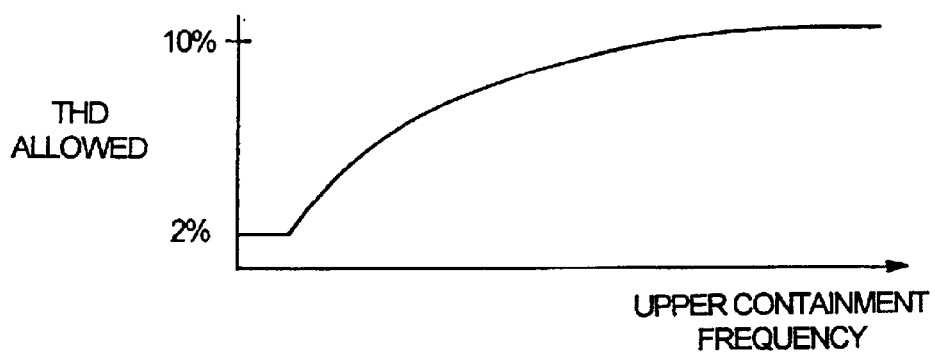
FIG. 9 is plot showing a second transfer function for varying a distortion threshold logarithmically.
Figure 10:
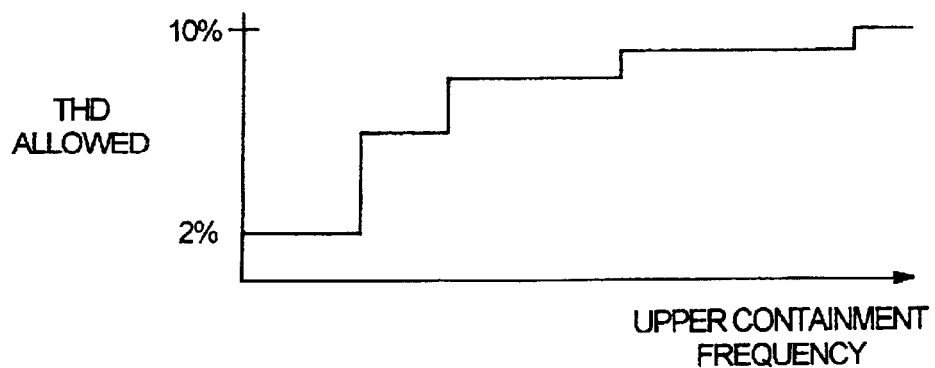
FIG. 10 is plot showing a first transfer function for varying a distortion threshold in stepwise fashion.

FIG. 9 shows an alternative embodiment wherein a substantially continuous transfer function provides a continuously increasing distortion threshold as the upper containment frequency increases. This embodiment requires that the power amplifier IC utilize a continuously adjustable distortion threshold. Alternatively, the power amplifier can be modeled with the DSP to predict amplifier clipping and to generate a simulated clip signal using any desired threshold. Preferably, the transfer function is logarithmic to match the nonlinear psycho-acoustic auditory response of human hearing. As shown in the embodiment of FIG. 10, the threshold may increase stepwise using a plurality of steps. Preferably, the steps may increase logarithmically, as shown.

Figure 11:
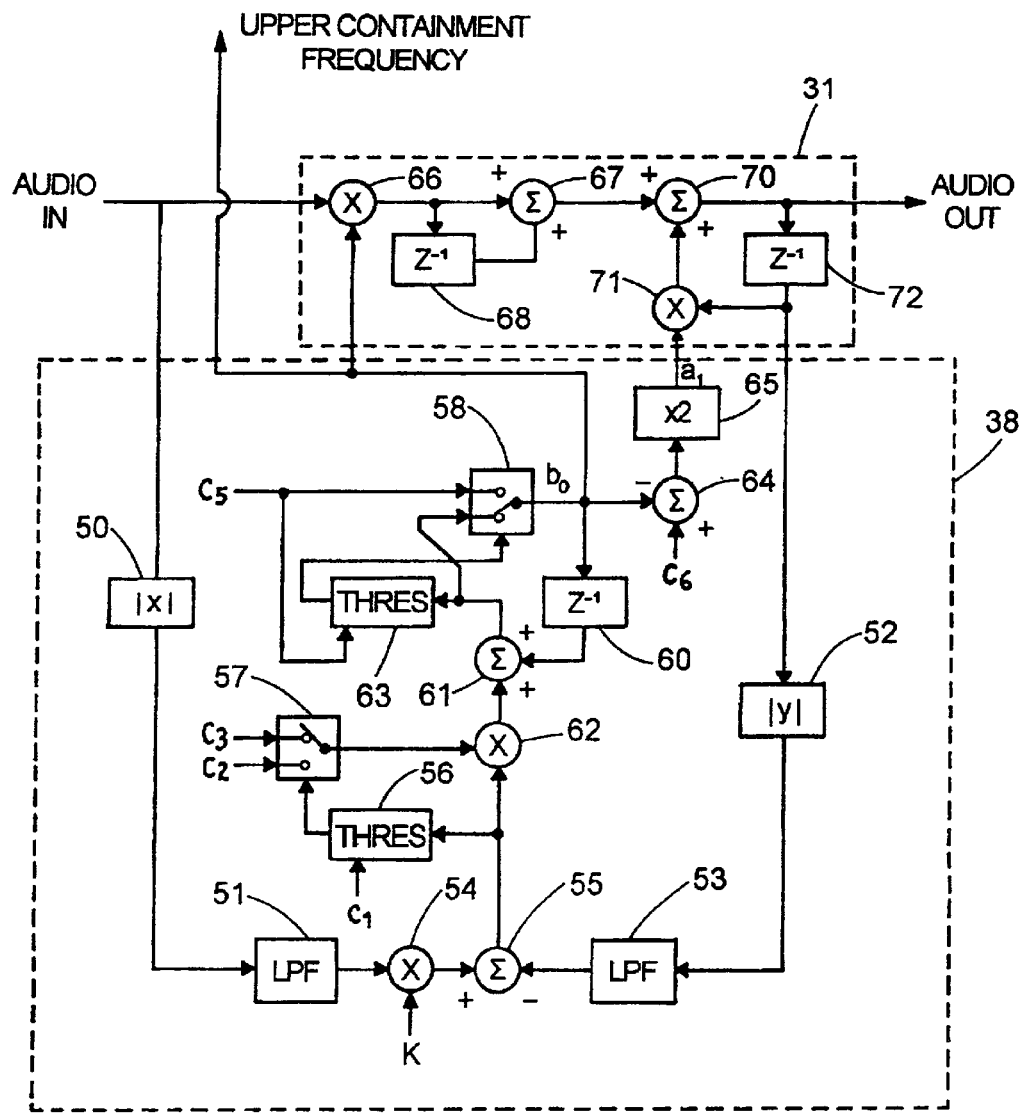
FIG. 11 is a block diagram showing a preferred embodiment of an LMS adaptive filter for determining an upper containment frequency for characterizing spectral content of an audio signal.

Frequency analyzer 38 containing LMS adaptation 46 and generating the upper containment frequency signal is shown in FIG. 11 together with further details of filter 31. An input averager is comprised of an absolute value block 50 providing a rectified audio signal to a lowpass filter 51. Similarly, the output audio signal is provided through an absolute value block 52 to a lowpass filter 53. Lowpass filters 51 and 53 are preferably comprised of butterworth IIR filters having an upper cutoff frequency of about 100 Hz. The difference between the average audio output from LPF 53 and the ratioed input average from a multiplier 54 is derived in a summer 55. A threshold block 56 receives a constant $c_1$ which is preferably equal to zero so that threshold block 56 identifies the positive or negative sign of the difference from summer 55. If the difference is negative (i.e., the output signal average is greater than intended), then threshold block 56 controls a multiplexer 57 to switch to an attack time constant $c_2$. Otherwise, multiplexer 57 is switched to decay time constant $C_3$. The product of the error and the attack or delay time constant produces an adaptation delta for adapting the filter.

The adaptive filter of the present invention preferably takes the form of an infinite impulse response (IIR) filter. A first order filter is preferred having the form of $$y_n = b_0(x_n + x_{n-1}) + a_1(y_{n-1})$$

where y is the filter output, x is the filter input and $b_0$ and $a_1$ are the adaptive filter coefficients. In order to ensure that the filter coefficients track one another to provide unity gain in the filter, a relationship between the filter coefficients preferably exists as follows:

$$a_1 = (0.5 - b_0) \times 2.$$

As shown in FIG. 11, filter coefficient $b_0$ is obtained at the output of a multiplexer 58. Coefficient $b_0$ is delayed through a $z^{-1}$ unit delay block 60 and then applied to one input of a summer 61. A second input of summer 61 receives the adaptation delta from a multiplier 62 so that coefficient $b_0$ can be updated according to the adaptive value of delta. The output of summer 61 is coupled to the input of a threshold block 63 and to one input of multiplexer 58. Threshold block 63 compares the output of summer 61 (i.e., the updated value of coefficient $b_0$) to a constant $c_5$ representing the minimum frequency to which the upper cutoff frequency of the filter should be lowered. In other words, $c_5$ represents a lower adaptation limit value for coefficient $b_0$. Constant $C_5$ is also coupled to the remaining input of multiplexer 58. The output of threshold block 63 controls multiplexer 58 to select the updated value of coefficient $b_0$ from summer 61 unless the $b_0$ would fall below constant $C_5$, in which case multiplexer 58 is switched to select the minimum value $C_5$.

In order to obtain coefficient $a_1$, the current value of $b_0$ is coupled to a subtracting input of a summer 64. An adding input of summer 64 receives a constant $c_6$ which is preferably equal to 0.5. The output of summer 64 is doubled in an doubling block 65 to provide coefficient $a_1$ at its output.

Adaptive filter 31 includes a multiplier 66 for multiplying coefficient $b_0$ and the current value of the audio input signal $x_n$. The output of multiplier 66 is connected to a summing input of a summer 67 and to a second input of summer 67 through a unit delay block 68. The output of summer 67 is connected to a summing input of a summer 70. Filter coefficient $a_1$ is provided to one input of a multiplier 71. The output of summer 70 is applied to a second input of multiplier 71 through a unit delay block 72. Thus, filter 31 implements the first order IIR filter equation specified above.

Coefficient $b_0$ is referred to as the gain of the filter and it also identifies the upper containment frequency of the filter. Therefore, it is provided to threshold adjuster 37 for supplying the input value for the transfer function to generate the appropriate distortion threshold of the present invention.

What is claimed is:

1. Apparatus comprising:

an audio source generating an audio signal;

a pre-amplifier coupled to said audio source and having a controllable gain for pre-amplifying said audio signal;

a power amplifier coupled to said pre-amplifier and having a substantially fixed gain for amplifying said pre-amplified audio signal;

a threshold adjuster for generating a distortion threshold representative of an amount of distortion to be allowed to be introduced by said power amplifier in response to a frequency content of said audio signal;

a distortion detector coupled to said power amplifier and generating a distortion signal in response to said distortion threshold and said audio signal;

a gain limiter for reducing said controllable gain if said distortion signal exceeds said distortion threshold.

2. The apparatus of claim 1 further comprising:

a frequency analyzer coupled to said audio source and generating a frequency detection signal for characterizing said frequency content of said audio signal, said frequency detection signal being coupled to said threshold adjuster.

3. The apparatus of claim 2 wherein said frequency detection signal is proportional to an upper frequency below which a predetermined portion of said audio signal is contained.

4. The apparatus of claim 3 wherein said distortion threshold increases in response to an increase of said frequency detection signal.

5. The apparatus of claim 3 wherein said distortion threshold increases logarithmically in response to an increase of said frequency detection signal.

6. The apparatus of claim 3 wherein said distortion threshold increases stepwise in response to an increase of said frequency detection signal.

7. The apparatus of claim 3 wherein said distortion threshold varies in a range between about 2% and about 10% in response to said frequency detection signal.

8. The apparatus of claim 1 wherein said threshold adjuster determines said frequency content in response to an identity of said audio source.

9. The apparatus of claim 8 wherein said apparatus is an automotive audio system having a plurality of audio sources including an AM radio tuner and wherein said threshold adjuster generates a distortion threshold corresponding to a low distortion level when said AM radio tuner is providing said audio signals and generates a distortion threshold corresponding to a higher distortion level when said AM radio tuner is not providing said audio signals.

10. A method of limiting distortion in an audio system comprising the steps of:

generating an audio signal from an audio source;

pre-amplifying said audio signal in response to a controllable gain;

power amplifying said pre-amplified audio signal in response to a fixed gain;

characterizing a frequency content of said audio signal;

generating a distortion threshold in response to said characterized frequency content, said distortion threshold representative of an amount of distortion to be allowed to be created by said power amplification;

detecting a distortion level being introduced by said power amplification; and reducing said controllable gain if said detected distortion level exceeds said distortion threshold.

11. The method of claim 10 wherein said characterizing step is comprised of determining a frequency content inherent in said audio source.

12. The method of claim 11 wherein said audio source is selected from multiple sources including an AM radio tuner, and wherein a relatively lower distortion threshold is generated in response to said AM radio tuner being selected.

13. The method of claim 10 wherein said characterizing step is comprised of measuring said frequency content using a frequency analyzer.

14. The method of claim 13 wherein said frequency analyzer generates a frequency detection signal proportional to an upper frequency below which a predetermined portion of said audio signal is contained.

15. The method of claim 14 wherein said distortion threshold increases in response to an increase of said frequency detection signal.

16. The method of claim 14 wherein said distortion threshold increases logarithmically in response to an increase of said frequency detection signal.

17. The method of claim 14 wherein said distortion threshold increases stepwise in response to an increase of said frequency detection signal.

18. The method of claim 14 wherein said distortion threshold varies in a range between about 2% and about 10% in response to said frequency detection signal.

* * * * *